US008207038B2

(12) United States Patent
Cheng et al.

(10) Patent No.: US 8,207,038 B2
(45) Date of Patent: Jun. 26, 2012

(54) STRESSED FIN-FET DEVICES WITH LOW CONTACT RESISTANCE

(75) Inventors: Kangguo Cheng, Guilderland, NY (US); Bruce B. Doris, Slingerlands, NY (US); Ali Khakifirooz, Slingerlands, NY (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/786,397

(22) Filed: May 24, 2010

(65) Prior Publication Data

US 2011/0284967 A1 Nov. 24, 2011

(51) Int. Cl.
*H01L 21/336* (2006.01)
(52) U.S. Cl. .................. 438/283; 438/157; 257/E21.442
(58) Field of Classification Search .................. 438/157, 438/283, 197, 597, 938, 481; 257/E21.442
See application file for complete search history.

(56) References Cited

U.S. PATENT DOCUMENTS

| | | | | |
|---|---|---|---|---|
| 7,115,945 B2 | 10/2006 | Lee | | 257/329 |
| 7,300,837 B2 * | 11/2007 | Chen et al. | | 438/213 |
| 7,538,351 B2 | 5/2009 | Chen | | 257/67 |
| 2005/0136617 A1 * | 6/2005 | Jang | | 438/427 |
| 2005/0202618 A1 * | 9/2005 | Yagishita | | 438/197 |
| 2005/0224800 A1 * | 10/2005 | Lindert et al. | | 257/66 |
| 2006/0088967 A1 * | 4/2006 | Hsiao et al. | | 438/296 |
| 2008/0006908 A1 | 1/2008 | Lin | | 257/619 |
| 2008/0085587 A1 * | 4/2008 | Wells et al. | | 438/455 |
| 2008/0096334 A1 * | 4/2008 | Kobayashi | | 438/157 |
| 2008/0217663 A1 | 9/2008 | Doris | | 257/274 |
| 2008/0265321 A1 | 10/2008 | Yu | | 257/344 |
| 2008/0265338 A1 * | 10/2008 | Yu et al. | | 257/397 |
| 2009/0101978 A1 * | 4/2009 | Anderson et al. | | 257/365 |
| 2009/0114955 A1 * | 5/2009 | Stapelmann et al. | | 257/255 |
| 2009/0242990 A1 * | 10/2009 | Saitoh et al. | | 257/351 |
| 2009/0283837 A1 * | 11/2009 | Huebinger et al. | | 257/369 |
| 2010/0052059 A1 * | 3/2010 | Lee | | 257/368 |

* cited by examiner

*Primary Examiner* — Kiesha Bryant
*Assistant Examiner* — Abbigale Boyle
(74) *Attorney, Agent, or Firm* — George Sai-Halasz; Louis J. Percello

(57) ABSTRACT

A method for fabricating an FET device is disclosed. The method includes Fin-FET devices with fins that are composed of a first material, and then merged together by epitaxial deposition of a second material. The fins are vertically recesses using a selective etch. A continuous silicide layer is formed over the increased surface areas of the first material and the second material, leading to smaller resistance. A stress liner overlaying the FET device is afterwards deposited. An FET device is also disclosed, which FET device includes a plurality of Fin-FET devices, the fins of which are composed of a first material. The FET device includes a second material, which is epitaxially merging the fins. The fins are vertically recessed relative to an upper surface of the second material. The FET device furthermore includes a continuous silicide layer formed over the fins and over the second material, and a stress liner covering the device.

9 Claims, 5 Drawing Sheets

STRESSED FIN-FET DEVICES WITH LOW CONTACT RESISTANCE

BACKGROUND

The present invention relates to electronic devices of very large scale integration (VLSI) circuits. In particular, it relates to Fin type FET devices.

As FET (Field-Effect-Transistor) devices are being scaled down, the technology becomes more complex, and changes in device structures and new fabrication methods are needed to maintain the expected performance improvements from one successive device generation to the next. Fin-FET or Tri-Gate devices offer possible avenues to continue on the path of miniaturization.

BRIEF SUMMARY

A method for fabricating an FET device is disclosed. The method includes receiving Fin-FET devices with fins that are composed of a first material. The method also includes the merging of the fins by an epitaxial deposition of a second material, and recessing the fins vertically using a selective etch. Furthermore, a continuous silicide layer is formed over the first material and over the second material, followed by deposition of a stress liner overlaying the silicide.

An FET device is disclosed, which FET device includes a plurality of Fin-FET devices, the fins of which are composed of a first material. The FET device includes a second material, which is epitaxially merging the fins to one another in pairwise manner. The fins are recessed in a vertically offset position relative to an upper surface of the second material. The FET device furthermore includes a continuous silicide layer formed over the fins and over the second material, and a stress liner overlaying the silicide layer.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1A:
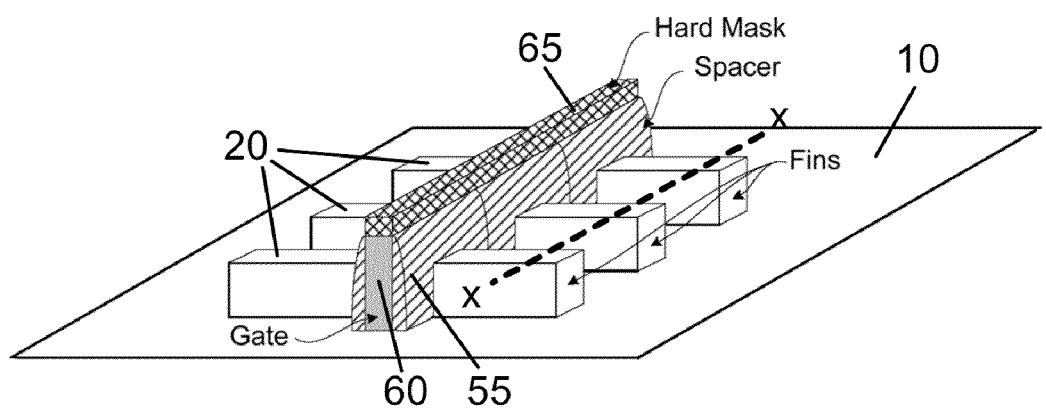
FIGS. 1A and 1B symbolically show respective inclusive, and cross sectional views of an initial stage for an embodiment of the disclosure.

It is understood that Field Effect Transistor-s (FET) are well known in the electronic arts. Standard components of an FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending whether the "on state" current in the channel is carried by electrons or by holes, the FET comes in two types: as NFET or PFET. (In different nomenclature the NFET and PFET devices are often referred to as NMOS and PMOS devices.)

A Fin-FET, or Tri-Gate, device is an FET device but with a particular geometric configuration. These devices are non-planar, they are three dimensional structures hosted by a fin structure. In Fin-FETs, the body of the transistor is formed in a fin rising out of a planar background, typically having both vertical and horizontal surfaces. The gate of the Fin-FET may engage the top surface, as well as the vertically oriented body surfaces on both faces, or sidewalls, resulting in several planes being used for transistor channel formation. Such FET devices, with fin-type bodies, have several advantages as known in the art. In embodiments of the present invention, the dimensions of fin structures that serve as fin-type device bodies may be of a height of about 5 nm to 50 nm, and of a width of between 3 nm to about 30 nm.

There is great difficulty in maintaining performance improvements in devices of deeply submicron generations. One general approach for improving performance is to try to increase carrier (electron and/or hole) mobilities. A promising avenue toward better carrier mobility is to apply tensile or compressive stress in the semiconductor channel regions. Typically, it may be preferable to have the channel of electron conduction type devices, such as NFET, in tensile stress, while to have the channel of hole conduction type devices, such as PFET, in compressive stress. In the case of the more common planar devices a method know in the art for stressing channels is the deposition of so called stress liners. Stress liners are insulating layers covering the devices, which layer are under stress, and then impart the stress onto the device channels. It is known that the stress distribution is such that if a stressing layer which covers a planar FET, is, for instance, in tensile stress, then the channel of the FET will also be under tensile stress, while the source and drain of the same device would be under compressive stress. For compressive stress one has the mirror situation: a stress liner in a compressive state of stress imparts compressive stress onto the device channel. Consequently, one may generally apply tensile stressing layers to cover NFET devices and compressive stressing layers to cover PFET devices.

Applying stress to non-planar, three dimensional (3D) FETs, such as a Fin-FET, or Tri-Gate device, may be more difficult. Stress liners commonly used for planar devices are not very efficient, partly because of the 3D nature of the device, and partly because of the shrinking of the device pitch as technology progresses. Smaller device pitch leads to thinner stress liners, and that results in less channel stress. One way to increase the stress coupling to Fin-FET channel regions is to recess, namely etch down, the source/drain area of the fins. However, the recessed fins may lead to a significant increase in the device parasitic resistance. An embodiment of the present invention increases stress coupling to the channel and may not effect negatively the device parasitic resistance.

FIG. 1A symbolically shows an inclusive view of an initial stage of an embodiment of the disclosure. This initial stage is that of receiving a plurality of Fin-FET devices. The term of receiving is intended to be inclusive of any possible manner by which one may arrive at this initial stage of an embodiment. The plurality of Fin-FET devices may have just reached this stage of fabrication, or they may have been supplied by an some source for the purpose to apply the embodiments of the instant invention. FIG. 1A shows three Fin-FET devices, however this is only for illustrative purposes. Embodiments of the present disclosure may have only two Fin-FET devices, or may have several hundreds, or more. The Fin-FET device arrangement shown in FIG. 1A usually is configured to act as a single FET device. Often in a given integrated circuit (IC) a Fin-FET device is manufactured having only a single device width, which width is that portion of the fin circumference that is engaged by the gate. Multiple device widths for circuit operations are achieved by connecting single Fin-FET devices to each other in parallel. This may be accomplished by electrically connecting the source side fins to each other, and the drain side fins to each other.

Manufacturing of NFET, PFET, and Fin-FET devices is established in the art. It is understood that there are large number of steps involved in such processing, and each step may have practically endless variations, known to those skilled in the art. For embodiments of this disclosure it is understood that the whole range of known processing techniques are available for fabricating the devices, and only those process steps will be detailed that are related to the embodiments of the present invention.

The Fin-FET devices, as displayed in FIG. 1A, as well as all Fin-FET devices in embodiments of the present disclosure may be any kind of Fin-FET devices, fabricated in any manner. They may be, for example, and without intent of limiting, oxide dielectric or high-k dielectric devices, they may be polysilicon gate or metal gate devices, or of any further kind. The fabrication may have so called gate first, or gate last, variations, or further kinds The semiconductor material of the fins may be the mainstay material of microelectronics, namely silicon (Si). But, more broadly, they may be of Si based materials, such as a silicon-germanium (SiGe) alloy, or Si with a carbon content Si:C. Furthermore, other semiconductors, such as compound semiconductors, are not excluded. The fin material typically is in single-crystal form.

Accordingly, the Fin-FET devices shown in the figures may be regarded as representative embodiments of Fin-FET devices in general. In typical embodiments of the instant invention the Fin-FET devices are fabricated over a platform 10, which maybe be a buried oxide layer (BOX). Such BOX layer is typical in the art, but embodiments of the present invention do not depend on the platform 10 being a BOX layer. The platform 10 supporting the Fin-FET devices could be of other insulators, semiconductors, or metallic substances, or any other is use without limitation.

In embodiments of the present disclosure, the material that the fins are composed of is referred to as the first material. The first material 20 of the fins rests over the platform 10. On one side of the gate 60 the fins are the source terminals, on the other side of the gate the fins are the drain terminals. FIG. 1A also shows spacers 55, and there may be further sub-layers involved in, and around, the gate 60. As an example, a hardmask 65, which may have been used in patterning and processing the gate 60 and the spacers 55, is also shown. This mask layer 65 may or may not be removed during further processing.

Figure 1B:
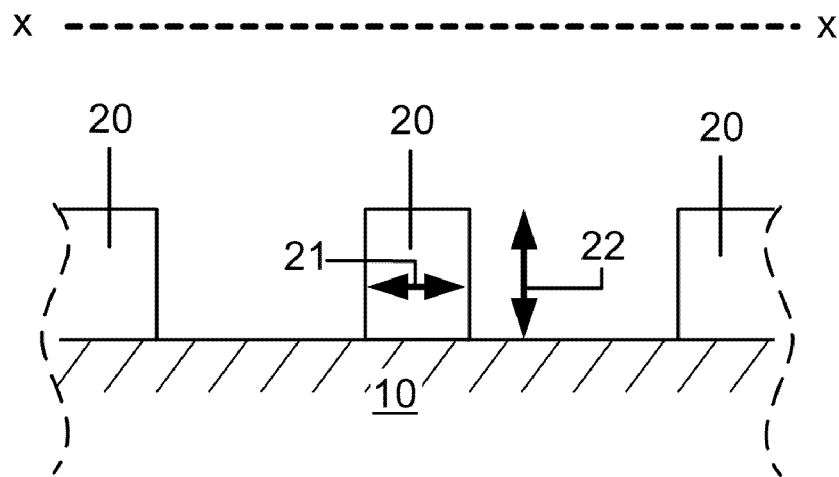

The dashed line, delimited with "x"-s in FIG. 1A, indicates a cut line where all the cross sectional views of the figures of the disclosure are shown, including FIG. 1B. The direction of the "x" cut line is shown at the top of FIG. 1B. At this stage of the processing the cross section shows only the first material 20 of the fins, on top of the platform 10. The devices being processed usually are part of a larger IC on a chip. This is depicted on various figures by the wavy dashed line boundaries, indicating that the drawing typically may only be a small fraction of a circuit, or even a small fraction of only a single device structure. Various directions and dimensions are also indicated in FIG. 1B. The width 21 the first material 20 of the fins is defined as the fin dimension substantially in parallel with the surface of the platform 10. The direction indicated by the arrow 22 is the one in which the height of the fins is measured. The height direction is substantially vertical to the surface of the platform 10.

Figure 2A:
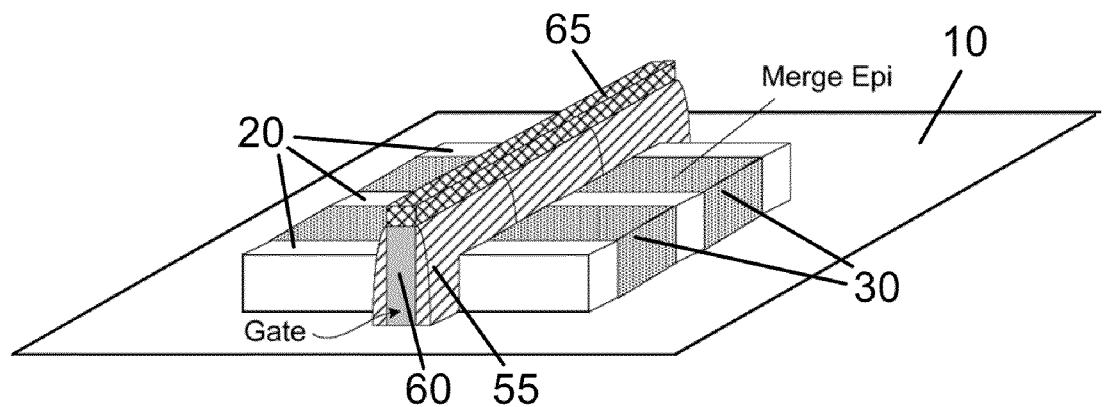
FIGS. 2A and 2B symbolically show respective inclusive, and cross sectional views after an epitaxial merging of the fins.
Figure 2B:
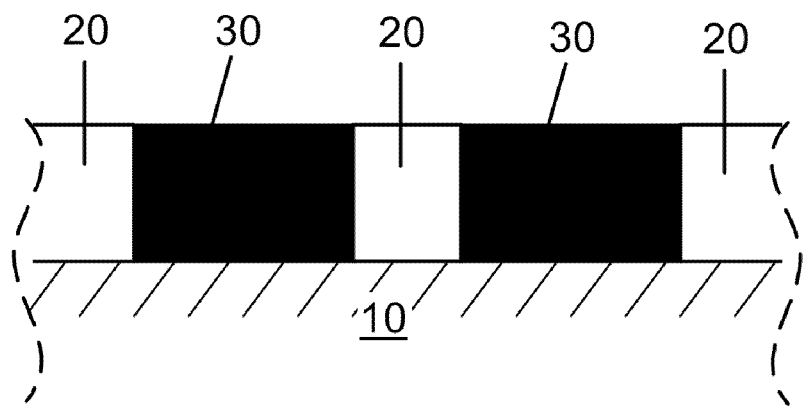

FIGS. 2A and 2B symbolically show respective inclusive, and cross sectional views after the epitaxial merging of the fins. The fins, typically both on the source side and the drain side, are merged in a pairwise manner with an epitaxial second material 30. Epitaxial deposition is a known technique of the VLSI fabrication art. In describing a structure, the adjective "epitaxial" is typically used to indicate that a particular material has been epitaxially deposited. The structural consequence of epitaxial deposition is that the deposited material and the host material, at their common interface, have the same symmetry and crystalline orientation. Further terms that may be used, such as "epitaxial relation", "epitaxially", "epitaxy", "epi", "epitaxial growth" etc. carry their customary usage, namely crystalline continuity across the interface. Typical techniques used in epitaxy may include molecular beam epitaxy (MBE), chemical vapor deposition (CVD), ultra high vacuum CVD (UHCVD), rapid thermal CVD (RTCVD), or further known methods.

The monocrystalline first material of the fins 20 may itself serve as the seed surface for the epitaxial deposition of the second material 30. The epitaxy of the second material may have been carried out in a selective manner, meaning that the epitaxial growth occurs only over certain surfaces, for instance over the fins, while other surfaces stay essentially free of the second material. Selective epitaxial growth has known techniques in the art. FIGS. 1A and 1B schematically depict the situation where possible surplus epitaxial material has already been removed, for instance from the upper surfaces of the fins. Such removal may take the form of various dry or wet etchings, including timed and selective etchings, or removal by polishing, as these are all known techniques in the art. In representative embodiments of the invention the second material 30 may have resulted from epitaxial growth on the side surfaces of the fins. A hard mask (not shown) on the upper surfaces of the fins may facilitate the selective growth on the sidewalls. The epitaxial deposition may be stopped once the second material growing on the sidewalls of neighboring fins fills up the space in-between the fins. At that point the fins are pairwise merged, a continuous material has been formed along the gate 60, and/or the sidewall 55. FIG. 2B shows the cross sectional profile with the first material 20 of the fins alternating with the epitaxially deposited second material 30.

The second material 30 may have been so selected as to have differing etch properties in relation to the first material 20 of the fins. It may be desirable that for certain selective etches the first material 20 of the fins etches at a faster rate than the second material 30. Such requirements may be satisfied in embodiments of the invention by several different combination of material selections. Some of the combinations my include the followings. The first material being essentially pure Si, and the second material being a SiGe alloy mixture with between 20% and 60% Ge concentration. Or, the first material may essentially be pure Si or SiGe alloy mixture, and the second material may be Si:C with between 1% and 5% C concentration. In alternate embodiments, the first material may be a SiGe alloy mixture, typically with less than 15% Ge concentration, and the second material 30 would also be a SiGe alloy mixture, but with a differing Ge concentration than that of the first material. Typically, if the Ge concentration differs between the first and second materials by at least 20%, that may be sufficient to lead to the desired difference in etching rates. In alternate embodiments the first material may be a SiGe alloy mixture, typically with less than 15% Ge concentration, and the second material may be Si:C with between 1% and 5% C concentration. Or, first material may be a Si:C, and the second material being a SiGe alloy mixture with between 20% and 60% Ge concentration. In a further embodiments, the first material 20 may be a SiGe alloy mixture, with between 20% and 60% Ge concentration, and the second material 30 may be essentially pure Si. In further embodiments the second material may be a non-Si based semiconductor, for instance, a compound semiconductor, such as, without limiting intent, GaAs.

In representative embodiments of the present disclosure it may be desirable to achieve low resistivity electrical connections between the fins, consequently one may dope the second material 30 to the same type of conductivity as the first material 20 of the fins. Such doping may be performed during the epitaxial growth of the second material, in so called in-situ doping schemes, as known in the art. Both p-type and n-type dopants are well known in the art, and any of them may be used in the embodiments of the present disclosure for doping both the first material 20 of the fins and second material 30.

A further consideration in selecting the first and second materials may involve the state of stress in each. If the second material 30 has a larger lattice constant than the first material 20 of the fins, then at their mutual interface the first material may be in a tensile state of stress, and the second material in a compressive state of stress. It is well known that the lattice constant of Si:C is smaller than that of Si, approximately in proportion with the carbon content. It is also known that the lattice constant of SiGe is larger than that of Si, approximately in proportion with the germanium content. Consequently, the selection of the second material 30 may also depend on the desired stress state in the channels of the Fin-FET devices. As discussed already, the channel is typically oppositely stressed than the source or drain part of the fin. Consequently, for NFET devices, where the channel carriers are electrons and tensile stress is advantageous in the channel, one may select the first material 20 of the fins to be essentially Si or a SiGe alloy mixture with less than 15% Ge concentration, and the second material 30 to be Si:C with between 1% and 5% C concentration. With such a selection the second material may impart a compressive stress onto the fins, resulting in a tensile stress in the Fin-FET device channel. For PFET devices, where the channel carriers are holes and compressive stress is advantageous in the channel, one may select the first material 20 of the fins to be essentially Si, Si:C, or a SiGe alloy mixture with less than 15% Ge concentration, and the second material to be SiGe alloy mixture with between 20% and 60% Ge concentration, but typically with at least 20% higher Ge concentration than that of the first material. With such a selection the second material may impart a tensile stress onto the fins, resulting in a compressive stress in the Fin-FET device channel.

In further embodiments of the invention it may occur that the stress, which would arise from a lattice constant difference between the first material 20 of the fins and the second material 30, becomes relaxed due to lattice defects, such as dislocations. In such embodiments the potential mutual stress effects may be left out of consideration when selecting compositions for the first and second materials.

Figure 3A:
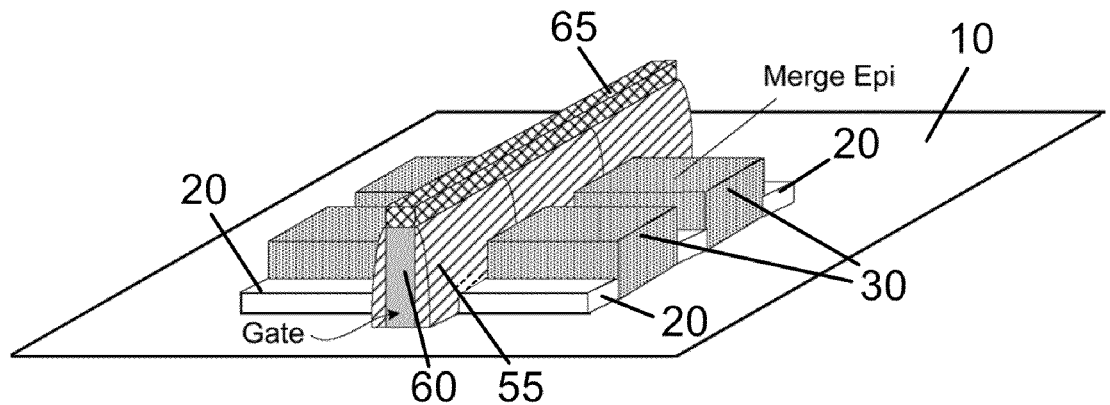
FIGS. 3A and 3B symbolically show respective inclusive, and cross sectional views after the recessing of the fins.
Figure 3B:
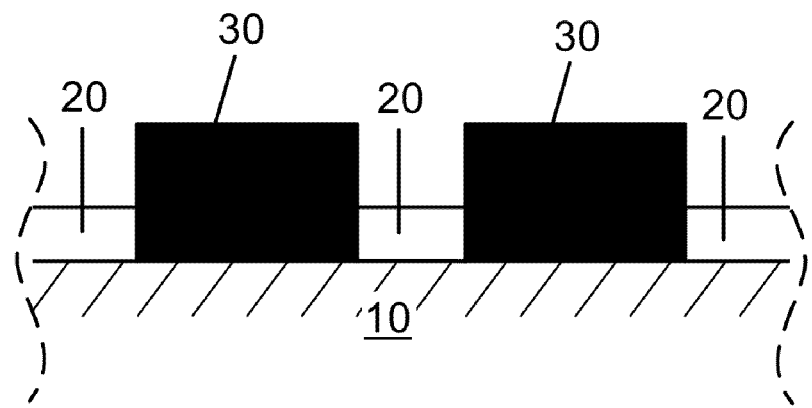

FIGS. 3A and 3B symbolically show respective inclusive, and cross sectional views after the recessing of the fins. Following the epitaxial merging of the fins, as schematically depicted in FIGS. 2A and 2B, a selective etch is applied to the Fin-FET devices. The selectivity of the etch is such that the first material 20 of the fins is removed at a faster rate than the second material 30. The degree of selectivity, namely the difference between the etch rates of the first and second materials, is desired to be as high as possible. Details of the desired final FET device's dimensions, and desired device performance may determine the minimum acceptable etching selectivity between the first and second materials. In representative embodiments of the invention, one may aim to achieve a selectivity of at least 2 to 1, namely that the first material 20 of the fins etches twice as fast as the second material 30. Such selective etches are known in the art. For instance, Si can be etched by KOH, TMAH, or ammonia solutions selectively to SiGe with Ge content greater than 20%. Alternatively, one may implant the Si first with an n-type dopant, and then grow the Si:C or SiGe epitaxial second material. The doped silicon can be removed selectively with respect to Si:C or SiGe using dry etch processes, known in the art for etching doped Si. If the first material is SiGe and the second material essentially pure Si, one may use etching processes that selectively etch Si relative to SiGe. Such etches are know in the art, for instance, and without intent of limiting, $H_2SO_4$, hot ammonium hydroxide hydrogen peroxide and water (SC1), or dry etches that include HCl. In reference to Si:C, Si etches at a higher rate in Secco etch, known in the art, than does Si:C.

FIGS. 3A and 3B schematically depict the FET device after the selective etching is completed. As shown, the first material 20 of the fins is recessed in a vertically offset position relative to an upper surface of the second material 30. The recessing of the fins is instrumental in improving stress coupling between the Fin-FET device channel and a stress liner, which may be applied at a later stage of the fabrication. In an embodiment of the disclosure, following the selective etching, the gate sidewall 55, and possibly other layers around the gate 60, may be re-formed, or re-fabricated.

Figure 4A:
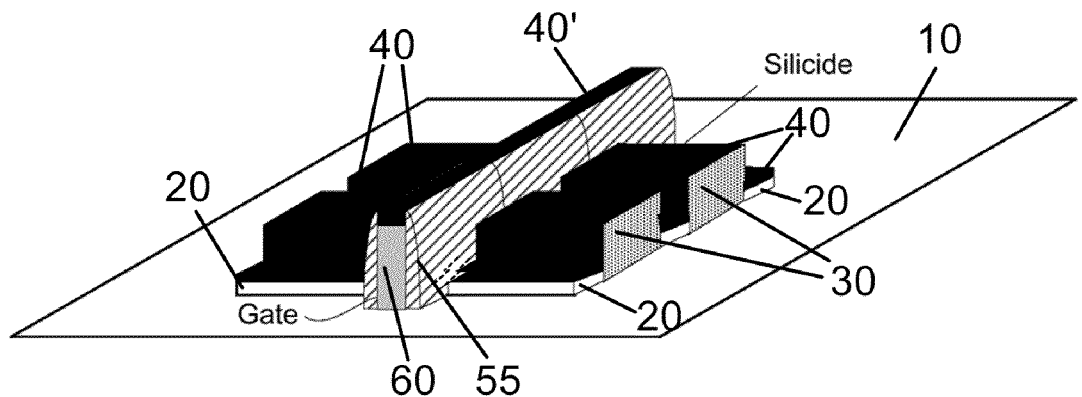
FIGS. 4A and 4B symbolically show respective inclusive, and cross sectional views after silicidation of the fins and of the merging material.
Figure 4B:
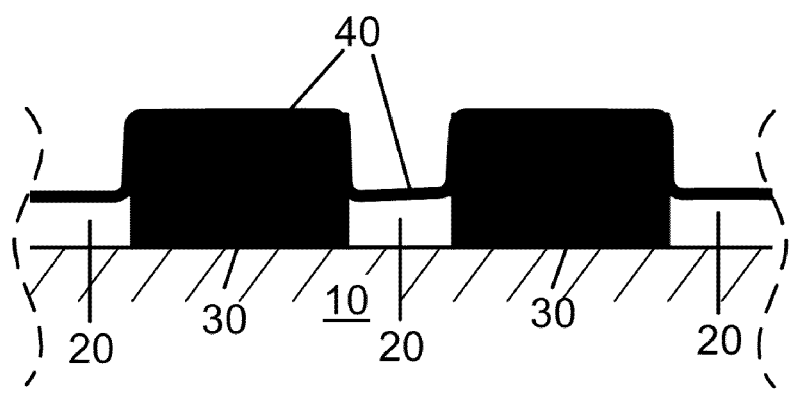

FIGS. 4A and 4B symbolically show respective inclusive, and cross sectional views after silicidation of the fins and of the merging material. Some embodiments of the invention aim for minimizing parasitic device resistance which may result from the recessing of the fins. The first and second materials are of such kind that would allow for silicide formation over both of them. Forming of silicide is a know fabrication step in VLSI processing, and one may select for embodiments of the instant application any of the known silicides of the art, for instance, but not limited to Ni, Ti, Co, Pt silicides. The silicide formation may typically be carried out in a self aligned manner, as known in the art. The silicide layer, as well, may impart stress onto the fins and onto the merging material, which stress may be considered when selecting the silicide material.

The common continuous layer of silicide 40 may lower the contact resistivity of the FET device, since the recess formation of the fins and the second material leads to an increase in the contact area. At the same time, since the recess itself is in the fins, where proximity between a stress liner and the device channel is needed, channel stress may increase.

FIG. 4A displays an embodiment where the mask layer 65 has been removed from the gate 60 prior to silicidation. During the silicidation of the first material and of the second material, a silicide layer 40' is also formed over the exposed layer on the top of the gate, which layer may be a polysilicon layer. Silicide layer 40' on top of the gate, may or may not, be present in embodiments of the present invention.

Figure 5:
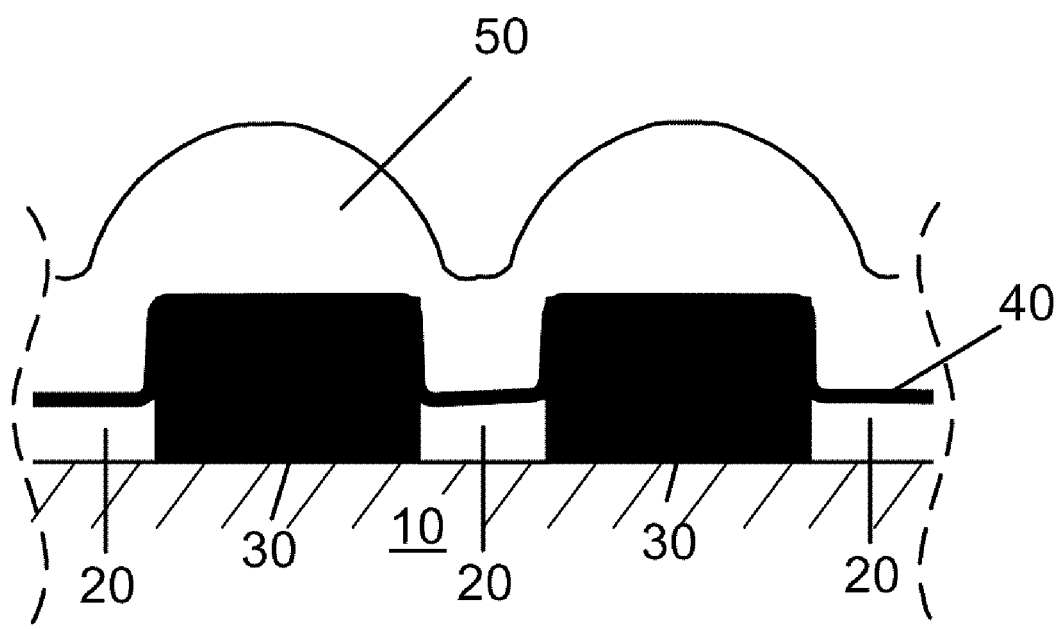
FIG. 5 symbolically shows a cross sectional view after deposition of a stress liner.

FIG. 5 symbolically shows a cross sectional view after deposition of a stress liner. The formation of the silicide 40 may be followed by depositing a stress liner 50 over the FET device made up of the Fin-FET devices. Deposition of a stress liner 50 may follow known processes of the art. One may typically select a nitride material for the stress liner. Depending on the details of the deposition process, the nitride material of the stress liner 50 may be implemented in either a compressive or in a tensile state of stress. For PFET devices one may select for stress liner 50 a nitride layer which is in a compressive state of stress. Conversely, for NFET devices one may select for stress liner 50 a nitride layer which is in a tensile state of stress. The stress liner may cover the whole of the FET, or only portions of it, for instance, may only cover the silicided 40 portions.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "upper", "side," "over", "underneath" etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before" or "after", does not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method for fabricating an FET device, the method comprising:
   receiving Fin-FET devices, wherein the Fin-FET devices have fins, and the fins are composed of a first material;
   merging the fins by an epitaxial deposition of a second material;
   recessing the fins vertically with a selective etch, wherein the selective etch removes the first material at a faster rate than the second material; and
   forming in a self aligned manner a continuous silicide layer over the first material and over the second material.

2. The method of claim 1, wherein the method further comprises:
   depositing a stress liner overlaying the self aligned silicide layer.

3. The method of claim 2, wherein the method further comprises:
   selecting the stress liner to be a nitride layer.

4. The method of claim 1, wherein the method further comprises:
   in-situ doping the second material during the epitaxial deposition.

5. The method of claim 1, wherein the method further comprises:
   selecting the second material in such manner that after the epitaxial deposition the second material imparts a stress onto the fins.

6. The method of claim 1, wherein the method further comprises:
   selecting the first material to be essentially Si, SiGe alloy mixture, or Si:C, and selecting the second material to be a SiGe alloy mixture with between 20% and 60% Ge concentration.

7. The method of claim 1, wherein the method further comprises:
   selecting the first material to be essentially Si or SiGe alloy mixture, and selecting the second material to be Si:C with between 1% and 5% C concentration.

8. The method of claim 2, wherein the method further comprises:
   selecting the FET device to be an NFET device, and selecting the stress liner to be in a tensile state of stress.

9. The method of claim 2, wherein the method further comprises:
   selecting the FET device to be a PFET device, and selecting the stress liner to be in a compressive state of stress.

* * * * *